United States Patent [19]
Ngo et al.

[11] Patent Number: 5,812,019
[45] Date of Patent: Sep. 22, 1998

[54] OPEN-LOOP MR BIASING CIRCUIT WITH HIGH POWER SUPPLY AND COMMON MODE REJECTION

[75] Inventors: Tuan V. Ngo, Eden Prairie; Craig M. Brannon, Maplewood, both of Minn.

[73] Assignee: VTC Inc., Bloomington, Minn.

[21] Appl. No.: 781,845

[22] Filed: Jan. 10, 1997

[51] Int. Cl.⁶ .................................................. G05F 1/10
[52] U.S. Cl. ............................. 327/538; 360/66; 360/67
[58] Field of Search ............................. 327/52, 538, 551, 327/530; 360/66, 67

[56] References Cited

U.S. PATENT DOCUMENTS

| | | | |
|---|---|---|---|
| 4,802,130 | 1/1989 | Soneda | 365/205 |
| 4,833,559 | 5/1989 | Belk | 360/113 |
| 4,879,610 | 11/1989 | Jove et al. | 360/67 |
| 4,918,406 | 4/1990 | Baumbach et al. | 331/117 R |
| 5,103,353 | 4/1992 | Jove et al. | 360/67 |
| 5,309,295 | 5/1994 | Bailey et al. | 360/66 |
| 5,363,249 | 11/1994 | Fitzmorris | 360/46 |
| 5,386,326 | 1/1995 | Harman | 360/66 |
| 5,534,818 | 7/1996 | Peterson | 327/545 |
| 5,543,979 | 8/1996 | Davies | 360/67 |

*Primary Examiner*—Timothy P. Callahan
*Assistant Examiner*—Jung Ho Kim
*Attorney, Agent, or Firm*—Kinney & Lange, P.A.

[57] ABSTRACT

An open-loop biasing circuit for a magnetoresistive element provides high common mode and power supply rejection. Two current sources are connected together by two conduction paths. A first conduction path has two impedances. One impedance is tied between the first current source and ground and the second impedance is tied between the second current source and ground. The second conduction path includes the magnetoresistive element. A capacitive path between the two current sources reduces power supply noise and a voltage follower reduces parasitic capacitance in the capacitive path.

34 Claims, 2 Drawing Sheets

OPEN-LOOP MR BIASING CIRCUIT WITH HIGH POWER SUPPLY AND COMMON MODE REJECTION

BACKGROUND OF THE INVENTION

The present invention relates to an open-loop biasing circuit for biasing a magnetoresistive element. In particular, the present invention relates to an open-loop biasing circuit with improved power supply and common mode rejection.

The present invention is typically used in a computer disc drive as part of a "read" channel that includes a magnetic-field sensing element used to "read" information stored on a magnetic disc. The information is stored on the disc as a series of small magnetic domains which produce a series of small localized magnetic fields. To "read" the stored information, the sensing element passes over the disc and creates an electrical signal based on the direction of the magnetic fields. The remainder of the read channel converts the electrical signal into a digital signal that is decoded to reproduce the stored information.

One type of sensing element, known as a magnetoresistive or MR head, "reads" the stored magnetic information by measuring changes in the electrical resistance of a material within the head as the head passes through the magnetic fields. To convert the changes in resistance into a usable voltage signal, MR heads are typically biased with a current that creates a voltage drop across the resistive portion of the MR head. Ideally, the bias current is controlled so that any changes in the voltage drop across the MR head are attributed to changes in the resistance of the head. Thus, when the head is properly biased, the voltage across the head tracks the changes in the magnetic fields, making the voltage useful as a read signal.

Often, the voltage across the MR head is amplified by a differential amplifier. To improve the linearity of the differential amplifier, it is advantageous if the MR head is biased so that the MR head's two terminals have the same voltage magnitude but opposite voltage polarity from each other. When the MR head is biased in this manner, an increase in the resistance of the MR head due to a magnetic field causes an increase in the voltage of one terminal of the head and an equivalent decrease in the voltage of the other terminal of the head.

This type of biasing can be achieved using two different current sources, one coupled to each terminal of the MR head. The current sources and any additional biasing components, must be balanced relative to the MR head, so that the same magnitude voltage is developed at each terminal of the MR head. Thus, not only must the current sources create the same amount of current, but the impedance seen by one terminal of the MR head must be identical to the impedance seen by the other terminal of the MR head at all relevant frequencies (DC-200 MHz).

In some prior art biasing circuits, feedback loops have been used to keep the terminal voltages of the MR head centered about ground. These feedback loops use the voltages at the terminals of the MR head to control one of the current sources so that the voltages at the terminals are kept centered about ground. Although such feedback loops can be effective, they require a large number of devices to implement and are hampered by an inherent feedback loop delay.

In addition to having balanced current and resistive elements, the two terminals of the MR head should have matching frequency responses so as to remove any noise that is common to both current sources. In other words, an input noise signal that is common to both current sources should produce the same voltage increase or decrease at the two terminals of the MR head. If both terminals increase or decrease together, the voltage drop across the MR head remains the same and the common noise is not amplified. Common noise that is not amplified is considered suppressed or rejected, and this type of reaction to common noise is known as common mode rejection.

In MR head biasing circuits, common mode rejection is dependent on the capacitance seen by each terminal of the MR head since such capacitance determines the frequency response of each terminal. If one terminal sees more capacitance than the other terminal, the voltage at one terminal will change slower than the voltage at the other terminal for a given common noise signal. This will cause the common noise to be amplified by the differential amplifier and thereby will cause a deterioration of common mode rejection.

A second type of noise suppression is known as power supply rejection. This type of noise suppression attempts to eliminate noise that is found in only one of the two current or power sources.

In bias circuits that use feedback loops, power supply noise is reduced by monitoring the MR head's terminals for voltage offsets caused by power supply noise. If an offset is detected, the feedback loop is used to adjust one of the two current sources based on the offset voltage at the terminals of the head. By modifying one of the current sources, the voltage offset may be negated. Although such feedback circuits are effective at removing some noise frequencies, the delays inherent in the feedback loops limit the range of noise frequencies that the loops can suppress.

Power supply rejection can also be achieved by using capacitors. However, off-chip capacitors, those which are not formed within the same integrated circuit as the remainder of the biasing circuit, are expensive to add to the biasing circuit and, sometimes, are a source of additional noise in the circuit. Integrated circuit capacitors, although cheaper and easier to add to MR head biasing circuits, include unwanted parasitic capacitances.

The parasitic capacitances found in integrated circuit capacitors is caused by the physical structure of the capacitor, which is shown in cross-section in FIG. 2. The cross-section of FIG. 2 shows a typical integrated circuit capacitor with three terminal connections: upper-plate connection 20, lower-plate connection 22, and body connection 24. Preferably, all three terminal connections are composed of a metallic material. Upper-plate connection 20 has a large surface area composed of a width in the horizontal direction of FIG. 2 and a length in the direction orthogonal to the page of FIG. 2. This surface area allows upper-plate connection 20 to act as one plate of the capacitor.

Extending below the entirety of upper-plate connection 20 is insulating material 26. Insulating material 26 is typically formed as a single layer during the production of the capacitor. After insulating material 26 has been deposited, portions of the material are removed to provide openings so that lower-plate connection 22 and body connection 24 can make contact with parts of the capacitor located below insulating material 26.

Below insulating material 26, and extending under upper-plate connection 20 and lower-plate connection 22, is lower plate 30. Lower plate 30 is separated from upper-plate connection 20 by insulating material 26, but makes direct contact with lower-plate connection 22. Lower plate 30 is preferably constructed from a P-doped semi-conductor material. Lower plate 30, insulating material 26 and upper-plate connection 20 together form the desired nominal capacitance for this capacitor.

Lower plate 30 is deposited within body 28, also known as the tub. Body 28, which is deposited on a substrate 32, is in direct contact with body connection 24 and is preferably composed of an N-doped semi-conductor material. The fact that body 28 is N-doped and lower plate 30 is P-doped means that there is a P-N junction between lower plate 30 and body 28. This P-N junction creates the parasitic capacitance found in integrated circuit capacitors. Specifically, the P-N junction forms a significant junction capacitance because the P-N junction must be reverse biased at all times to prevent current from flowing from the lower plate to the body. This junction capacitance is not fixed, but instead, increases as the reverse-bias voltage across the junction increases. Thus, the parasitic capacitance is a function of the voltage difference between the body and the lower plate.

This parasitic capacitance makes it difficult to add integrated circuit capacitors to MR head biasing circuits since all of the capacitance added to the circuit must be balanced relative to the two terminals of the MR head to ensure good common mode rejection. Thus, both the nominal capacitance and the parasitic capacitance must be balanced in the circuit so that the two terminals of the MR head have the same frequency response to common noise. In the prior art, this balance has not been achieved, partly because the parasitic capacitance is voltage dependent. In some circuit layouts, this voltage dependence causes one terminal of the MR head to see a larger parasitic capacitance than the other terminal of the MR head, simply because one terminal is at a higher voltage than the other terminal. Thus, it has been difficult to achieve both high power supply and common mode rejection in MR head biasing circuits.

SUMMARY OF THE INVENTION

The present invention is an open-loop biasing circuit for a magnetoresistive element. The biasing circuit has two current sources that are coupled together by two conduction paths. The first conduction path has two impedances: a first impedance from the first current source to ground, and a second impedance from the second current source to ground. The second conduction path includes a magnetoresistive element.

In some embodiments of the present invention, the conduction path containing the magnetoresistive element also contains a first resistor between the first current source and the magnetoresistive element, and a second resistor between the second current source and the magnetoresistive element. Further, the total impedance of the magnetoresistive conduction path is generally much less than the total impedance of the first conduction path. The difference in impedances causes most of the current from the two current sources to flow through the magnetoresistive element, and establishes a relatively constant voltage through the two larger impedances in the first conduction path.

In still further embodiments of the present invention, a capacitive path is connected between the two current sources to improve power supply rejection. The capacitive path preferably includes an integrated circuit capacitor, which has a first conducting plate, a second conducting plate and a tub layer. The first conducting plate is connected to the first current source and the second conducting plate connected to the second current source. In still further embodiments of the present invention, the second conducting plate and the tub layer are connected to a voltage follower, which is capable of making the voltage at the tub layer track the voltage at the second conducting plate. One embodiment of such a voltage follower is a transistor with its emitter connected to the tub layer and its base connected to the second conducting plate. Since the voltage at the tub layer tracks the voltage at the second conducting plate, the parasitic capacitance between the two layers is eliminated.

In still further embodiments of the present invention, there are two capacitive pathways each containing an integrated circuit capacitor. Preferably, the integrated circuit capacitors are connected to the current sources in a complementary fashion so that the lower conducting plate of the first capacitor is connected to the second current source and the lower conducting plate of the second capacitor is connected to the first current source. In addition, the tub layers of each capacitor are connected to respective voltage followers so that their voltages track the voltages of their respective lower conducting plates. This tracking is accomplished in one embodiment by connecting the respective tub layers to the respective emitters of transistors and the respective conducting plates to the respective bases of the transistors.

By using an open-loop biasing circuit, the present invention limits the number of components needed to center the MR head's terminal voltages about ground. In addition, by connecting a voltage follower between a capacitor's tub layer and its bottom conducting plate, the present invention eliminates the parasitic capacitances between the conducting plate and the tub layer and thereby improves both power supply rejection and common mode rejection.

DETAILED DESCRIPTION OF THE PREFERRED EMBODIMENTS

Figure 1:
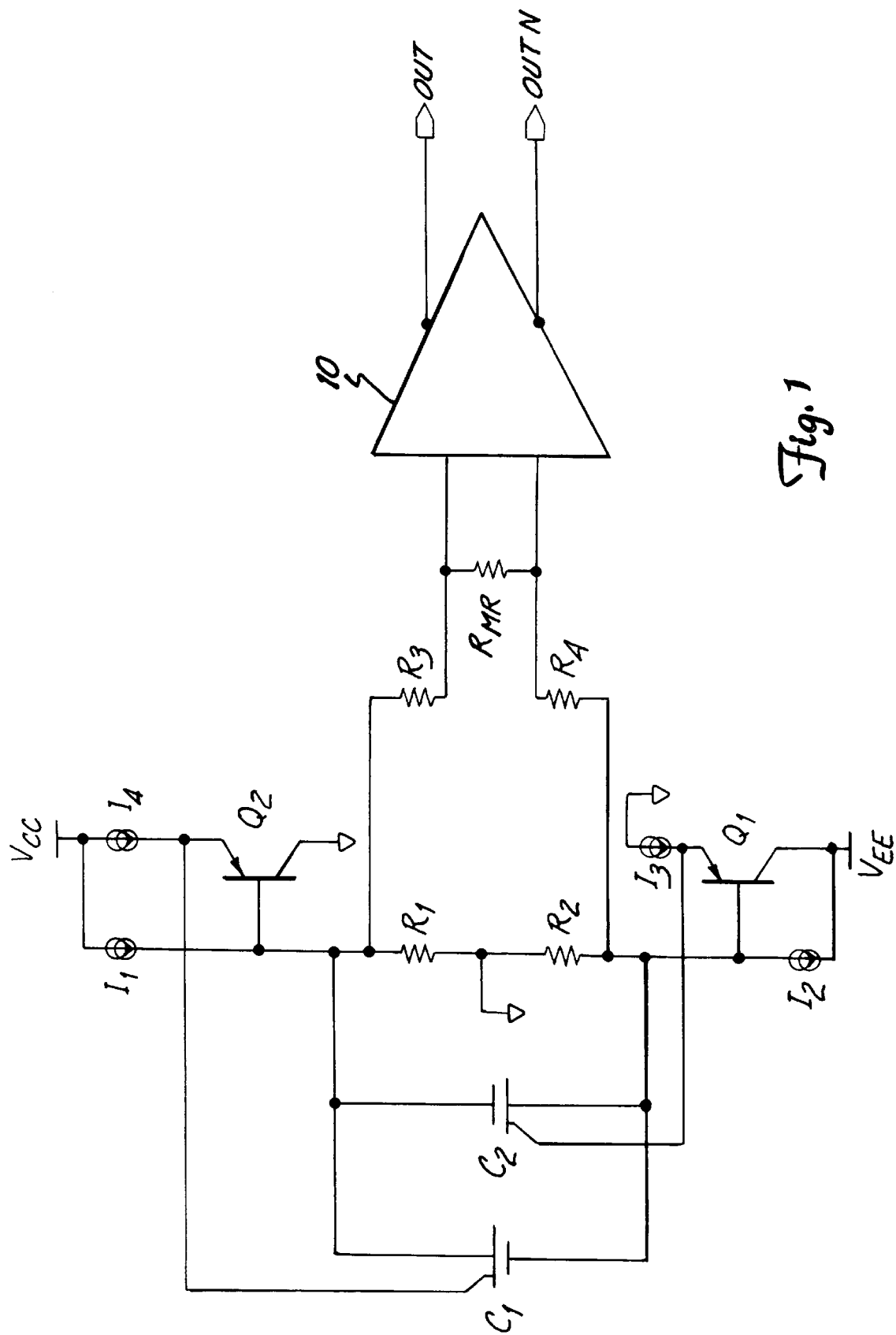
FIG. 1 is a circuit diagram of a bias circuit for an MR head according to the present invention.
Figure 2:
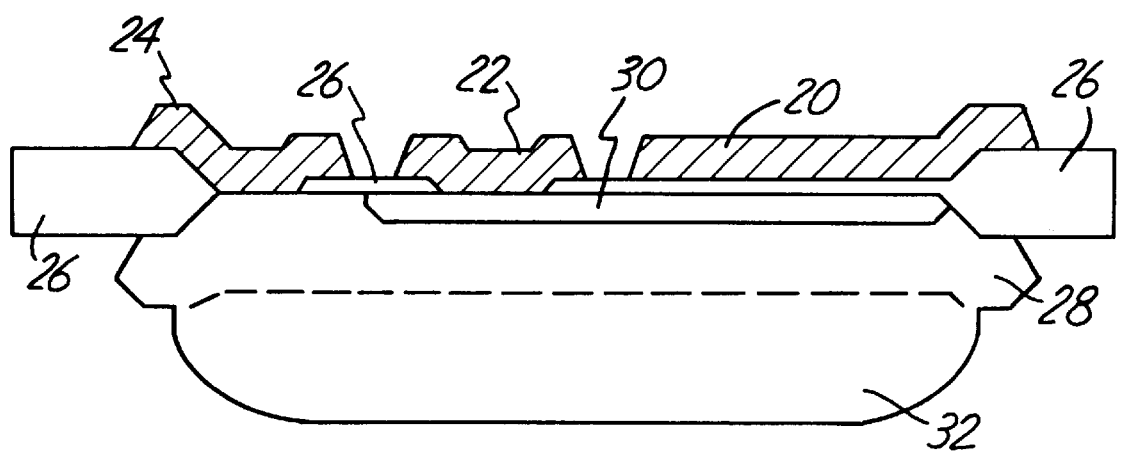
FIG. 2 is a cross-section of an integrated circuit capacitor.

FIG. 1 is a circuit diagram of the MR head biasing circuit of the present invention. Magnetoresistive element $R_{MR}$ has two terminals, each connected to differential amplifier 10. The voltage drop across magnetoresistive element, $R_{MR}$, is amplified by differential amplifier 10 to produce an output voltage between two outputs OUT and OUTN. The voltage between OUT and OUTN is considered to be zero when only a DC bias voltage exists across magnetoresistive element $R_{MR}$.

The bias voltage across magnetoresistive element $R_{MR}$ is created through a bias circuit constructed from current sources $I_1$ and $I_2$, and resistors $R_1$, $R_2$, $R_3$, and $R_4$. Current source $I_1$ has a first terminal connected to an upper power supply voltage $V_{CC}$ and a second terminal connected to one terminal of resistor $R_1$ and one terminal of resistor $R_3$. Current source $I_2$ has one terminal connected to lower power supply voltage $V_{EE}$ and a second terminal connected to one terminal of resistor $R_2$ and one terminal of resistor $R_4$. Resistors $R_1$ and $R_2$ form a first conduction path between current sources $I_1$ and $I_2$ because the second terminals of both resistor $R_1$ and resistor $R_2$ are connected to a reference voltage, preferably ground. Resistors $R_3$ and $R_4$ and magnetoresistive element $R_{MR}$ create a second conduction path between current source $I_1$ and current source $I_2$. Resistors $R_3$ and $R_4$ are each connected to a separate terminal of magnetoresistive element $R_{MR}$.

In preferred embodiments, the bias circuit of FIG. 1 is balanced such that current source $I_1$ provides the same amount of current to resistors $R_1$ and $R_3$ as current source $I_2$ draws from resistors $R_2$ and $R_4$. In addition, resistor $R_1$ preferably has the same impedance as resistor $R_2$; and resistor $R_3$ preferably has the same impedance as resistor $R_4$. Moreover, resistors $R_1$ and $R_2$ are together preferably much larger than the total impedance of resistor $R_3$, resistor $R_4$ and magnetoresistive element $R_{MR}$. For example, resistors $R_3$ and $R_4$ are preferably 200 Ω each, magnetoresistive element $R_{MR}$ is approximately 40 Ω and resistors $R_1$ and $R_2$ are 2 kΩ each. By selecting resistors $R_1$ and $R_2$ to be much larger than resistors $R_3$ and $R_4$ and magnetoresistive element $R_{MR}$, most of the current of current sources $I_1$ and $I_2$ is forced through magnetoresistive element $R_{MR}$. This minimizes unwanted power dissipation through resistors $R_1$ and $R_2$.

The balanced nature of the present invention causes the two terminals of the magnetoresistive element $R_{MR}$ to have bias voltages of equal magnitudes but opposite polarities. Furthermore, since resistors $R_1$ and $R_2$ are referenced to ground, the center of magnetoresistive element $R_{MR}$ is at ground, thereby aiding in keeping the voltages at the terminals of magnetoresistive element $R_{MR}$ centered about ground.

Although the elements described above may be used alone to bias the MR head in the present invention, the embodiment of the present invention shown in FIG. 1 also includes noise reduction elements used to improve power supply rejection. The noise reduction elements include PNP transistors $Q_1$ and $Q_2$, current sources $I_3$ and $I_4$, and capacitors $C_1$ and $C_2$. Capacitors $C_1$ and $C_2$ are preferably integrated circuit capacitors with terminal connections to an upper plate, a lower plate, and a tub or body. The lower plate of capacitor $C_1$ and the upper plate of capacitor $C_2$ are connected to current source $I_1$ and the base of transistor $Q_2$. The upper plate of capacitor $C_1$ and the lower plate of capacitor $C_2$ are connected to current source $I_2$ and the base of transistor $Q_1$. The body of capacitor $C_1$ is connected to the emitter of PNP transistor $Q_2$ and current source $I_4$, which has its other terminal connected to upper power supply voltage $V_{CC}$. The collector of transistor $Q_2$ is connected to a reference voltage, preferably ground. The body of capacitor $C_2$ is connected to the emitter of PNP transistor $Q_1$ and to current source $I_3$, which has a second terminal connected to a reference voltage, preferably ground. The collector of transistor $Q_1$ is connected to lower power supply voltage $V_{EE}$.

At low frequencies, capacitors $C_1$ and $C_2$ act as open circuits, and thus do not affect the DC biasing described above. At higher frequencies, capacitors $C_1$ and $C_2$ have a very low impedance, and thus act as a short circuit between current source $I_1$ and current source $I_2$. Thus, high frequency noise in the current signals of current source $I_1$ or current source $I_2$ are shunted away from magnetoresistive element $R_{MR}$. Through this shunting, the bias voltage across magnetoresistive element $R_{MR}$ is relatively unaffected by power supply noise in either current source $I_1$ or $I_2$. Thus, capacitors $C_1$ and $C_2$ provide high power supply rejection.

Although integrated circuit capacitors are preferred in the present invention, such capacitors have a parasitic capacitance created by their integrated circuit layout, as discussed above in the Background of the Invention. To remove the parasitic capacitance, the present invention uses a voltage follower, which causes the voltage of the tub or body to follow or track the voltage of the lower plate. In FIG. 1, the voltage follower for capacitor $C_2$ is formed by transistor $Q_1$ and current source $I_3$. The lower plate of capacitor $C_2$ is connected to the base of transistor $Q_1$ and the body of capacitor $C_2$ is connected to the emitter of transistor $Q_1$. In this configuration, transistor $Q_1$ acts as an emitter-follower so that its emitter voltage is maintained approximately 0.7 volts above its base voltage. As the voltage at the base of transistor $Q_1$ changes in response to noise in current source $I_1$, the voltage at the emitter of transistor $Q_1$ tracks or follows the changes. Thus, the tub is maintained 0.7 volts above the voltage of the lower plate of capacitor $C_2$. Since the voltages of the tub and lower plate increase and decrease together, the tub and lower plate do not act as a capacitive element in the circuit. Thus, the parasitic capacitance of the tub and lower plate is effectively negated by the voltage follower.

Although shown in parallel with capacitor $C_1$, capacitor $C_2$ could be used alone with the voltage follower created by transistor $Q_1$ and current source $I_3$. However, imperfections in the voltage follower make it preferable to have a second integrated circuit capacitor with its lower plate and upper plate connections reversed from capacitor $C_2$. With the additional capacitor, parasitic capacitance that can not be negated by the voltage follower will at least be partially mirrored at both terminals of the MR head. For instance, capacitor $C_1$ and its voltage follower created by current source $I_4$ and transistor $Q_2$, form a complementary circuit to capacitor $C_2$, and its voltage follower created by current source $I_3$ and transistor $Q_1$. The only difference between the two groups of elements is that the parasitic capacitance of $C_1$ is connected to current source $I_1$ and the parasitic capacitance of $C_2$ is connected to current source $I_2$. With this configuration, if the voltage followers cannot negate all of the parasitic capacitance, both current sources will see approximately the same residual parasitic capacitance. Thus, the capacitance seen by the two terminals of the MR head remains balanced.

The balanced design of the present invention, including the balance of the parasitic capacitances associated with the integrated circuit capacitors, ensures good common mode rejection for the magnetoresistive bias circuit while providing good power supply rejection. In addition, the use of large resistors referenced to ground in parallel with the magnetoresistive element increases common mode rejection by centering the bias voltages of the magnetoresistive terminals about ground.

Although the present invention has been described with reference to preferred embodiments, workers skilled in the art will recognize that changes may be made in form and detail without departing from the spirit and scope of the invention.

What is claimed is:

1. A biasing circuit for a magnetoresistive element, the biasing circuit comprising:

a first current source coupled to a first power supply, the first power supply at a first supply voltage;

a second current source coupled to a second power supply, the second power supply at a second supply voltage;

a first conduction path, between the first current source and the second current source, the first conduction path comprising first and second impedances, the first impedance connected to the first current source, and the second impedance connected between the second current source and the first impedance; and a second conduction path, between the first current source and the second current source, the second conduction path comprising a magnetoresistive element, a third impedance connected between the first current source and a first terminal of the magnetoresistive element, and a fourth impedance connected between the second current source and a second terminal of the magnetoresistive element.

2. The biasing circuit of claim 1 wherein the total impedance of the second conduction path is much less than the total impedance of the first conduction path.

3. A biasing circuit for a magnetoresistive element, the biasing circuit comprising:
   a first current source coupled to a first power supply, the first power supply at a first supply voltage;
   a second current source coupled to a second power supply, the second power supply at a second supply voltage;
   a first conduction path, between the first current source and the second current source, the first conduction path comprising first and second impedances, the first impedance connected to the first current source, and the second impedance connected between the second current source and the first impedance; and
   a second conduction path, between the first current source and the second current source, the second conduction path comprising a magnetoresistive element;
   a first capacitive path connected between the first current source and the second current source, the first capacitive path having a first capacitance.

4. The biasing circuit of claim 3 wherein the first capacitance is created by an integrated circuit capacitor comprising a first conducting plate connected to the first current source and a second conducting plate connected to the second current source, the first and second conducting plates separated from each other.

5. The biasing circuit of claim 4 wherein the integrated circuit capacitor further comprises a tub layer, the tub layer and the second conducting plate having a capacitance.

6. The biasing circuit of claim 5 further comprising a voltage follower, connected between the tub layer and the second conducting plate, the voltage follower capable of causing the voltage at the tub layer to track the voltage at the second conducting plate.

7. The biasing circuit of claim 6 wherein the voltage follower comprises a transistor connected to the tub layer and to the second conducting plate.

8. The biasing circuit of claim 7 wherein the voltage follower further comprises a third current source connected to the transistor.

9. The biasing circuit of claim 5 further comprising a second capacitive path, connected between the first and second current sources, the second capacitive path comprising a second integrated circuit capacitor, the second integrated circuit capacitor having a third conducting plate connected to the second current source, a fourth conducting plate connected to the first current source, and a second tub layer, the second tub layer and the fourth conducting plate having a capacitance.

10. The biasing circuit of claim 9 further comprising a second voltage follower, connected between the second tub layer and the fourth conducting plate, the second voltage follower capable of causing the voltage at the second tub layer to track the voltage at the fourth conducting plate.

11. The biasing circuit of claim 10 wherein the second voltage follower comprises a transistor connected to the second tub layer and to the fourth conducting plate.

12. The biasing circuit of claim 11 wherein the second voltage follower further comprises a fourth current source coupled to the transistor of the second voltage follower.

13. A circuit for biasing a magnetoresistive element, the circuit comprising:
   a first power source;
   a second power source;
   a first conduction path between the first and second power sources, the first conduction path comprising the magnetoresistive element;
   a first capacitive path from the first power source to the second power source, the first capacitive path comprising a first integrated circuit capacitor with a first conducting element connected to the first power source, a second conducting element connected to the second power source, and a tub layer; and
   a first voltage follower, comprising a first terminal connected to the second conducting element of the first integrated circuit capacitor and a second terminal connected to the tub layer of the first integrated circuit capacitor, the first and second terminals of the first voltage follower having voltages that increase and decrease together.

14. The circuit of claim 13 further comprising:
   a second capacitive path from the first power source to the second power source, the second capacitive path comprising a second integrated circuit capacitor comprising a third conducting element connected to the second power source, a fourth conducting element connected to the first power source and a second tub layer; and
   a second voltage follower, comprising a first terminal connected to the fourth conducting element and a second terminal connected to the second tub layer, the first and second terminals of the second voltage follower having voltages that increase and decrease together.

15. The circuit of claim 14 wherein the first voltage follower comprises a transistor and the second voltage follower comprises a transistor.

16. The circuit of claim 14 further comprising a second conduction path between the first and second power sources, the second conduction path comprising a first resistor connected between the first power source and a reference voltage source and a second resistor connected between the second power source and the reference voltage source.

17. A circuit for biasing a magnetoresistive element, the circuit comprising:
   a first power source;
   a second power source;
   a first resistor connected to the first power source;
   a second resistor connected between the second power source and the first resistor;
   a third resistor having first and second terminals, the first terminal connected to the first power source;
   a fourth resistor, having first and second terminals, the first terminal of the fourth resistor connected to the second power source;
   a magnetoresistive element, connected between the second terminal of the third resistor and the second terminal of the fourth resistor; and
   a noise reduction circuit connected between the first power source and the second power source.

18. The circuit of claim 17 wherein the noise reduction circuit comprises a capacitor having a first terminal, a second terminal and a third terminal, the capacitor's first terminal connected to the first power source, the capacitor's second terminal connected to the second power source and connected to a first terminal of a voltage follower, and the capacitor's third terminal connected to a second terminal of the voltage follower, the first and second terminals of the voltage follower having voltages that are capable of tracking each other.

19. The circuit of claim 18 wherein the noise reduction circuit further comprises a second capacitor having a first terminal, a second terminal, and a third terminal, the second capacitor's first terminal connected to the second power source, the second capacitor's second terminal connected to the first power source and a first terminal of a second voltage follower, and the second capacitor's third terminal connected to a second terminal of the second voltage follower, the first and second terminals of the second voltage follower having voltages that are capable of tracking each other.

20. The biasing circuit of claim 1 wherein the junction between the first and second impedances is connected to a reference voltage source.

21. The biasing circuit of claim 20 wherein the reference voltage source is ground.

22. The biasing circuit of claim 20 further comprising a first capacitive path connected between the first current source and the second current source, the first capacitive path having a first capacitance.

23. The biasing circuit of claim 22 wherein the first capacitance is created by an integrated circuit capacitor comprising a first conducting plate connected to the first current source and a second conducting plate connected to the second current source, the first and second conducting plates separated from each other.

24. The biasing circuit of claim 23 wherein the integrated circuit capacitor further comprises a tub layer, the tub layer and the second conducting plate having a capacitance.

25. The biasing circuit of claim 24 further comprising a voltage follower, connected between the tub layer and the second conducting plate, the voltage follower capable of causing the voltage at the tub layer to track the voltage at the second conducting plate.

26. The biasing circuit of claim 25 wherein the voltage follower comprises a transistor connected to the tub layer and to the second conducting plate.

27. The biasing circuit of claim 26 wherein the voltage follower further comprises a third current source connected to the transistor.

28. The biasing circuit of claim 24 further comprising a second capacitive path, connected between the first and second current sources, the second capacitive path comprising a second integrated circuit capacitor, the second integrated circuit capacitor having a third conducting plate connected to the second current source, a fourth conducting plate connected to the first current source, and a second tub layer, the second tub layer and the fourth conducting plate having a capacitance.

29. The biasing circuit of claim 28 further comprising a second voltage follower, connected between the second tub layer and the fourth conducting plate, the second voltage follower capable of causing the voltage at the second tub layer to track the voltage at the fourth conducting plate.

30. The biasing circuit of claim 29 wherein the second voltage follower comprises a transistor connected to the second tub layer and to the fourth conducting plate.

31. The circuit of claim 16 wherein the reference voltage source is ground.

32. The circuit of claim 17 wherein the junction between the first and second resistors is connected to a reference voltage source.

33. The circuit of claim 32 wherein the reference voltage source is ground.

34. The biasing circuit of claim 19 wherein the second voltage follower further comprises a fourth current source coupled to the transistor of the second voltage follower.

* * * * *